United States Patent
Zhang et al.

(10) Patent No.: US 8,513,889 B2
(45) Date of Patent: Aug. 20, 2013

(54) METHODS AND APPARATUS FOR TUNING MATCHING NETWORKS

(75) Inventors: Chunlei Zhang, Santa Clara, CA (US);
Sergio F. Shoji, San Jose, CA (US);
Andrey Semenin, Sunnyvale, CA (US);
Kartik Ramaswamy, San Jose, CA (US); James P. Cruse, Santa Cruz, CA (US); Bryan Liao, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 12/899,048

(22) Filed: Oct. 6, 2010

(65) Prior Publication Data

US 2011/0162798 A1     Jul. 7, 2011

Related U.S. Application Data

(60) Provisional application No. 61/253,727, filed on Oct. 21, 2009.

(51) Int. Cl.
*H03H 7/38* (2006.01)

(52) U.S. Cl.
USPC ...................................... 315/111.21; 118/715

(58) Field of Classification Search
USPC .............. 315/111.21, 111.41, 111.31, 111.71, 315/111.51, 111.61; 118/715, 723 R, 723 MR, 118/723 MA, 723 AN
See application file for complete search history.

(56) References Cited

U.S. PATENT DOCUMENTS

| | | | |
|---|---|---|---|
| 6,020,794 A | 2/2000 | Wilbur | |
| 6,313,584 B1 * | 11/2001 | Johnson et al. | 315/111.21 |
| 6,825,618 B2 * | 11/2004 | Pu et al. | 315/111.51 |
| 6,838,832 B1 | 1/2005 | Howald et al. | |
| 2001/0054383 A1 * | 12/2001 | Pu et al. | 118/723 I |
| 2003/0196757 A1 | 10/2003 | Todorow et al. | |
| 2005/0031796 A1 | 2/2005 | Wu et al. | |
| 2009/0000942 A1 | 1/2009 | Bai et al. | |

FOREIGN PATENT DOCUMENTS

JP      7012729 A     1/1995

OTHER PUBLICATIONS

Kolda, Tamara G. et al., "Optimization by Direct Search: New Perspectives on Some Classical and Modern Methods", SIAM Review, vol. 45, No. 3, pp. 385-482.
International Search Report and Written Opinion mailed May 26, 2011 for PCT Application No. PCT/US2010/052203.

* cited by examiner

*Primary Examiner* — David H Vu
(74) *Attorney, Agent, or Firm* — Moser Taboada; Alan Taboada

(57) ABSTRACT

Methods and apparatus for tuning matching networks are provided herein. A method of tuning a matching network includes providing a matching network coupling an RF source to a load, the matching network having a tunable element disposed at a first set point; increasing a value of the tunable element by a first step above the first set point; sensing a first adjusted value of a reflected RF power; decreasing the value of the tunable element by the first step below the first set point; sensing a second adjusted value of the reflected RF power; comparing the first and the second adjusted values of the reflected RF power; and moving the tunable element to a second set point that corresponds to a position having a lowest adjusted value of the reflected RF power. The method may be repeated until the reflected RF power falls within an acceptable reflected RF power range.

20 Claims, 4 Drawing Sheets

METHODS AND APPARATUS FOR TUNING MATCHING NETWORKS

CROSS-REFERENCE TO RELATED APPLICATIONS

This application claims benefit of U.S. provisional patent application Ser. No. 61/253,727, filed Oct. 21, 2009, which is herein incorporated by reference.

BACKGROUND

1. Field

The present invention generally relates to substrate process chambers and, more particularly, to tuning matching networks to match the impedance of a plurality of RF sources to a load within a substrate process chamber.

2. Description of the Related Art

Plasma enhanced substrate process chambers are widely used in the manufacture of integrated devices. In some plasma enhanced substrate process chambers, multiple radio frequency (RF) generators may be utilized to form and control the plasma. Each generator is connected to the substrate process chamber through a matching network. The matching network may be manually tuned and balanced for the percentage of power supplied by each generator. As a result of the manual tuning, significant trial and error substrate runs may be needed to further tune the match to minimize the reflected power. This manual trial and error process generally continues throughout processing to account for any drift in the chamber conditions. The currently used manual tuning is a slow and tedious process, reducing the efficiency of substrate processing.

Thus, the inventors have provided an improved method for tuning matching networks in substrate process chambers.

SUMMARY

Methods and apparatus for tuning a matching network are provided herein. In some embodiments, a method of tuning a matching network includes providing a matching network coupling an RF source to a load, the matching network having a tunable element disposed at a first set point. The value of the tunable element may be increased by a first step above the first set point. A first adjusted value of a reflected RF power is then read. The value of the tunable element is then decreased by the first step below the first set point and a second adjusted value of the reflected RF power is read. The first and the second adjusted values of the reflected RF power are compared and if the lowest adjusted value is lower than the initial read reflected RF power the tunable element is adjusted to a second set point that corresponds to a position having a lowest adjusted value of the reflected RF power. If the lowest adjusted value of the reflected RF power is not lower than the initial read reflected RF power the tuning method is repeated using a smaller step size. The method of tuning a matching network may be repeated until the reflected RF power falls within an acceptable reflected RF power range.

In some embodiments, a method of tuning a matching network includes a computer readable medium having instructions stored thereon which, when executed by a controller, causes the tuning of a match network by a method, wherein the matching network includes coupling an RF source to a load, the matching network having a tunable element disposed at a first set point. The value of the tunable element may be increased by a first step above the first set point. A first adjusted value of a reflected RF power is then read. The value of the tunable element is then decreased by the first step below the first set point and a second adjusted value of the reflected RF power is read. The first and the second adjusted values of the reflected RF power are compared and if the lowest adjusted value is lower than the initial read reflected RF power the tunable element is adjusted to a second set point that corresponds to a position having a lowest adjusted value of the reflected RF power. If the lowest adjusted value of the reflected RF power is not lower than the initial read reflected RF power the tuning method is repeated using a smaller step size. The method of tuning a matching network may be repeated until the reflected RF power falls within an acceptable reflected RF power range.

In some embodiments, a system for plasma processing of a substrate may include a process chamber for processing a substrate; a first RF source coupled to the process chamber through a first matching network coupled; a second RF source coupled to the process chamber through a second matching network; and a controller comprising computer readable medium having instructions stored thereon that, when executed, cause the controller to tune the first matching network and the second matching network to a load during a plasma process, wherein the first matching network coupled the first RF source to the load and includes a first tunable element disposed at a first set point. In some embodiments, the method of tuning the first matching network and the second matching network to the load during the plasma process may include (a) increasing a value of the first tunable element by a first step above the first set point; (b) sensing a first adjusted value of a reflected RF power; (c) decreasing the value of the first tunable element by the first step below the first set point; (d) sensing a second adjusted value of the reflected RF power; (e) comparing the first and the second adjusted values of the reflected RF power; and (f) moving the first tunable element to a second set point that corresponds to a position having a lowest adjusted value of the reflected RF power. The method may further include any of the other embodiments and variations disclosed herein.

BRIEF DESCRIPTION OF THE DRAWINGS

So that the manner in which the above summarized features of the present invention can be understood in detail, a more particular description of the invention may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

FIGS. 2-2A depict a schematic diagram of an illustrative matching network used in accordance with some embodiments of the present invention.

The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to methods of tuning matching networks. The inventive methods may advantageously increase productivity and efficiency of operating substrate process chambers by providing stable temperatures and stable output of power sources.

Figure 1:
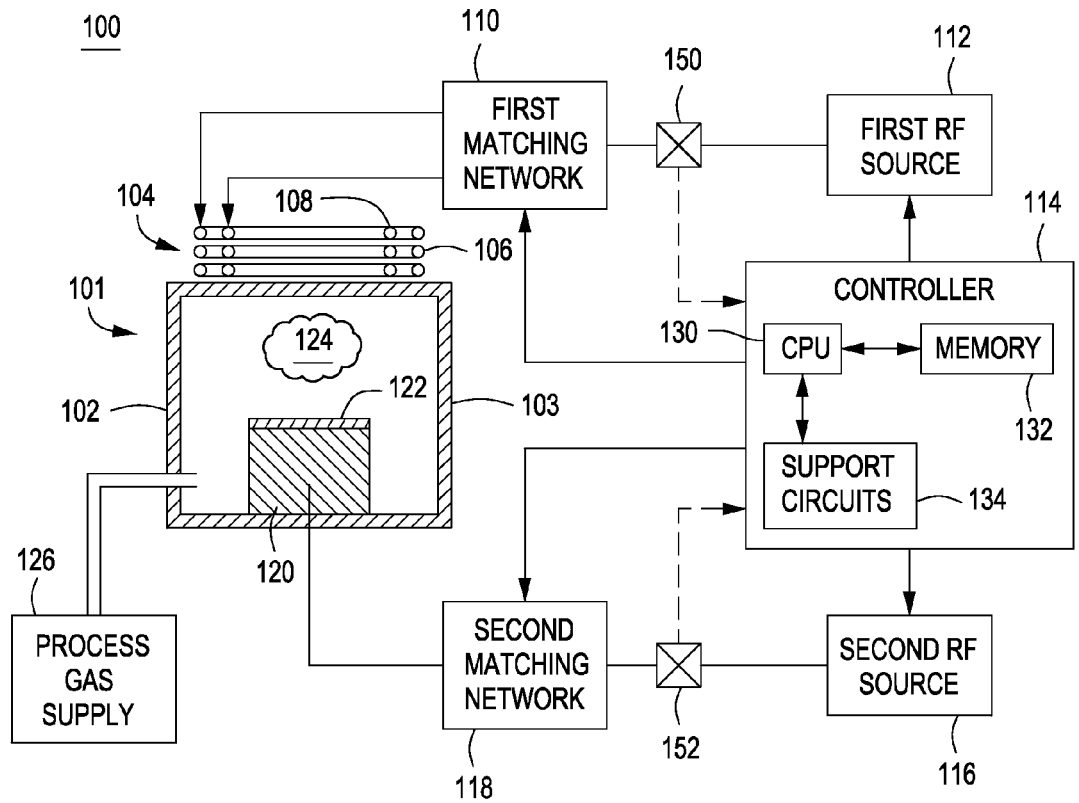
FIG. 1 depicts an apparatus suitable for processing of substrates in accordance with some embodiments of the present invention.

FIG. 1 depicts an apparatus suitable for a processing of substrates in accordance with some embodiments of the present invention. For example, FIG. 1 depicts a plasma enhanced substrate process system 100 that may be used, for example, for etching substrates 122 (or other work pieces). Although the disclosed embodiment of the invention is described in the context of a substrate process chamber used for etching, the invention is generally applicable to any form of plasma process that uses RF power delivered through a tunable matching network during a plasma enhanced process. Such reactors and/or processes include plasma annealing, plasma enhanced chemical vapor deposition, physical vapor deposition, plasma cleaning, and the like. Exemplary process chambers may include the DPS®, ENABLER®, ADVANT-EDGE™, or other process chambers, available from Applied Materials, Inc. of Santa Clara, Calif. It is contemplated that other suitable chambers that utilize plasma processing may benefit from the inventive methods disclosed herein.

This illustrative substrate process system 100 comprises a substrate process chamber 101, a process gas supply 126, a controller 114, a first RF source 112, a second RF source 116, a first matching network 110, and a second matching network 118. Either or both of the first and second RF sources 112, 116 may be configured for fast frequency tuning (e.g., the source may be able to vary frequency within about +/−5 percent in response to a sensed reflected power measurement in order to minimize reflected power). Such frequency tuning may require about 100 micro-seconds or much less to minimize the reflected power from a plasma in a given steady state.

The substrate process chamber 101 comprises a vacuum vessel 102 that contains a cathode pedestal 120 that forms a pedestal for a substrate 122. The roof or lid 103 of the process chamber has at least one antenna assembly 104 proximate the roof 103. The antenna assembly 104 may comprise a pair of antennas 106 and 108. Generally, one or more antennas or an electrode in combination or in lieu of an antenna may be used to couple RF energy to a plasma. In this particular illustrative embodiment, the antennas 106 and 108 inductively couple energy to the process gas or gases supplied by the process gas supply 126 to the interior of the vacuum vessel 102. The RF energy supplied by the antennas 106 and 108 is inductively coupled to the process gases to form a plasma 124 in a reaction zone above the substrate 122. The reactive gases formed by the plasma may, for example, etch the materials on the substrate 122 (although as discussed above other plasma processes may benefit from the invention disclosed herein).

In some embodiments, the power to the antenna assembly 104 ignites the plasma 124 and power coupled to the cathode pedestal 120 controls the plasma 124. As such, RF energy is coupled to both the antenna assembly 104 and the cathode pedestal 120. The first RF source 112 supplies energy to the first matching network 110 which couples the RF energy to the antenna assembly 104. Similarly, the second RF source 116 couples energy to the second matching network 118 which couples energy to the cathode pedestal 120. A controller 114 controls the timing of activating and deactivating the first and second RF sources 112 and 116 as well as tuning the first and second matching networks 110 and 118. The power coupled to the antenna assembly 104 is known as the source power and the power coupled to the cathode pedestal 120 is known as the bias power. In the embodiments of the invention, the source power, the bias power, or both can be operated in either a continuous wave (CW) mode or a pulsed mode.

A first indicator device 150 and a second indicator device 152 are used to determine the effectiveness of the ability of the matching networks 110, 118 to match to the plasma 124. In some embodiments, the indicator devices 150 and 152 monitor the power that is reflected from the respective matching networks 110, 118. These devices are generally integrated into the matching networks 110, 118, or power sources 112, 116; however, for descriptive purposes, they are shown here as being separate from the matching networks 110, 118. When reflected power is used as the indicator, the indicator devices 150 and 152 are respectively coupled between the power sources 112 and 116 and the matching networks 110 and 118. To produce a signal indicative of reflected power, the indicator devices 150 and 152 are directional couplers coupled to a RF detector such that the match effectiveness indicator signal is a voltage that represents the magnitude of the reflected power. A large reflected power is indicative of an unmatched situation. The signals produced by the indicator devices 150 and 152 are coupled to the controller 114. In response to an indicator signal, the controller 114 produces a tuning signal (matching network control signal) that is coupled to the matching networks 110, 118. This signal is used to tune the matching networks 110, 118. The tuning process strives to minimize or achieve a particular level of, for example, reflected power as represented in the indicator signal. The matching networks 110, 118 typically may require between about 100 microseconds to about a few milliseconds to minimize reflected power from a plasma in a given steady state.

Figure 2:
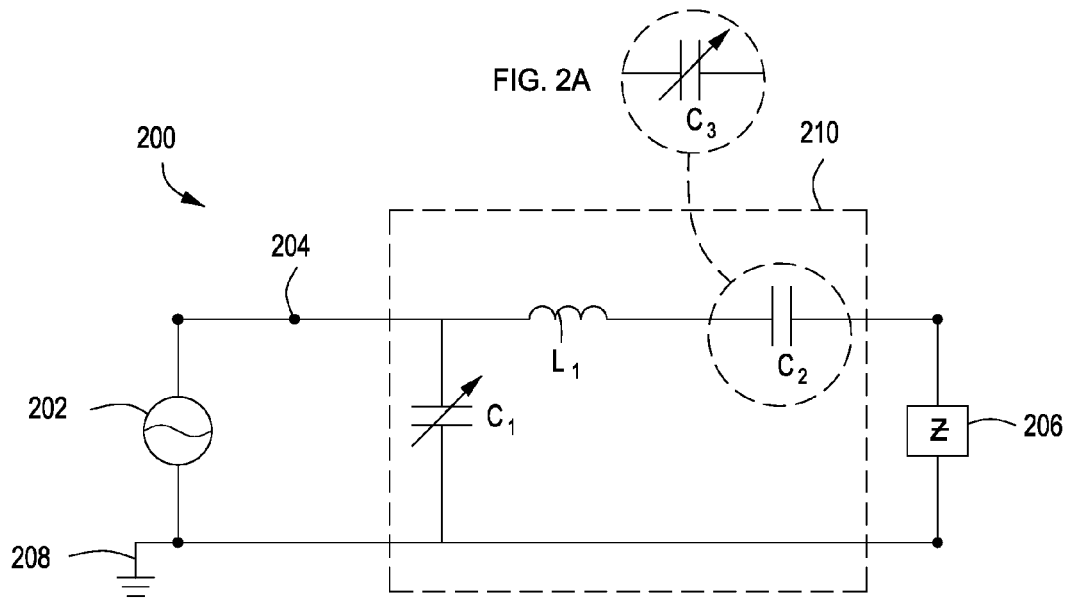

FIG. 2 depicts a schematic diagram of an illustrative matching network that may be used in accordance with some embodiments of the present invention. Specifically, FIG. 2 depicts a schematic diagram of an illustrative system 200 including a matching network used, for example, as the first RF matching network 110. This particular embodiment depicts a power source 202, a sensor 204, a matching circuit 210, a load 206, and a ground 208. In some embodiments, the load 206 may be the plasma 124 formed in the chamber 102. The matching circuit 210 is formed by capacitors, $C_1$ and $C_2$, and an inductor, $L_1$. The values of capacitor $C_1$ may be electronically or mechanically tuned to adjust the matching of the network 110. In lower power systems, the capacitor $C_1$ may be electronically tuned rather than mechanically tuned. In some embodiments, the matching circuit 210 may have a tunable inductor. In some embodiments, for example as depicted in FIG. 2A, the fixed capacitor $C_2$ may be replaced with a variable capacitor $C_3$, which may be electronically or mechanically tuned to adjust the matching of the network 110 in a similar manner as capacitor $C_1$. In some embodiments, the matching circuit 210 may have a capacitive shunt to ground. The power source 202 may be, for example, the first or second RF source 112 or 116 described above with respect to FIG. 1, and may operated in pulse or CW mode. The power source 202 that is matched by the network 210 provides power at an illustrative frequency of about 2 MHZ or about 13.56 MHz and has an illustrative power level of up to about 8000 Watts. The above described matching networks are illustrative only and other various configurations of matching networks having one or more adjustable elements for tuning the matching network may be utilized and tuned in accordance with the teachings provided herein.

Returning to FIG. 1, the controller 114 comprises a central processing unit (CPU) 130, a memory 132 and support circuits 134. The controller 114 is coupled to various components of the system 100 to facilitate control of the process. The controller 114 regulates and monitors processing in the chamber via interfaces that can be broadly described as analog, digital, wire, wireless, optical, and fiber optic interfaces. To facilitate control of the chamber as described below, the CPU 130 may be one of any form of general purpose computer processor that can be used in an industrial setting for controlling various chambers and sub processors. The memory 132 is coupled to the CPU 130. The memory 132, or a computer readable medium, may be one or more readily available memory devices such as random access memory, read only memory, floppy disk, hard disk, or any other form of digital storage either local or remote. The support circuits 134 are coupled to the CPU 130 for supporting the processor in a conventional manner. These circuits include cache, power supplies, clock circuits, input/output circuitry and related subsystems, and the like.

Process instructions are generally stored in the memory 132 as a software routine typically known as a recipe. The software routine may also be stored and/or executed by a second CPU (not shown) that is remotely located from the hardware being controlled by the CPU 130. The software routine, when executed by CPU 130, transforms the general purpose computer into a specific purpose computer (controller) 114 that controls the system operation such as that for controlling the plasma during the substrate process. Although the process of the present invention is discussed as being implemented as a software routine, some of the method steps that are disclosed therein may be performed in hardware as well as by the software controller. As such, the invention may be implemented in software as executed upon a computer system, and hardware as an application specific integrated circuit or other type of hardware implementation, or a combination of software and hardware.

Conventional matching networks and generators typically each contain control algorithms used for tuning the respective systems that are independent. Accordingly, each algorithm is not linked to the other with respect to the time or manner in which they both should be aiming to reduce the reflected power to the generator. The lack of such a link might cause a significant competition between the various tuning algorithms, and therefore, might cause system instabilities. In order to overcome this problem, methods for tuning a matching network are provided that advantageously facilitates the independent matching networks to make adjustments relative to and in response to the other matching networks, thus reducing competition between the matching networks, and thus, promoting improved overall system stability.

Figure 3:
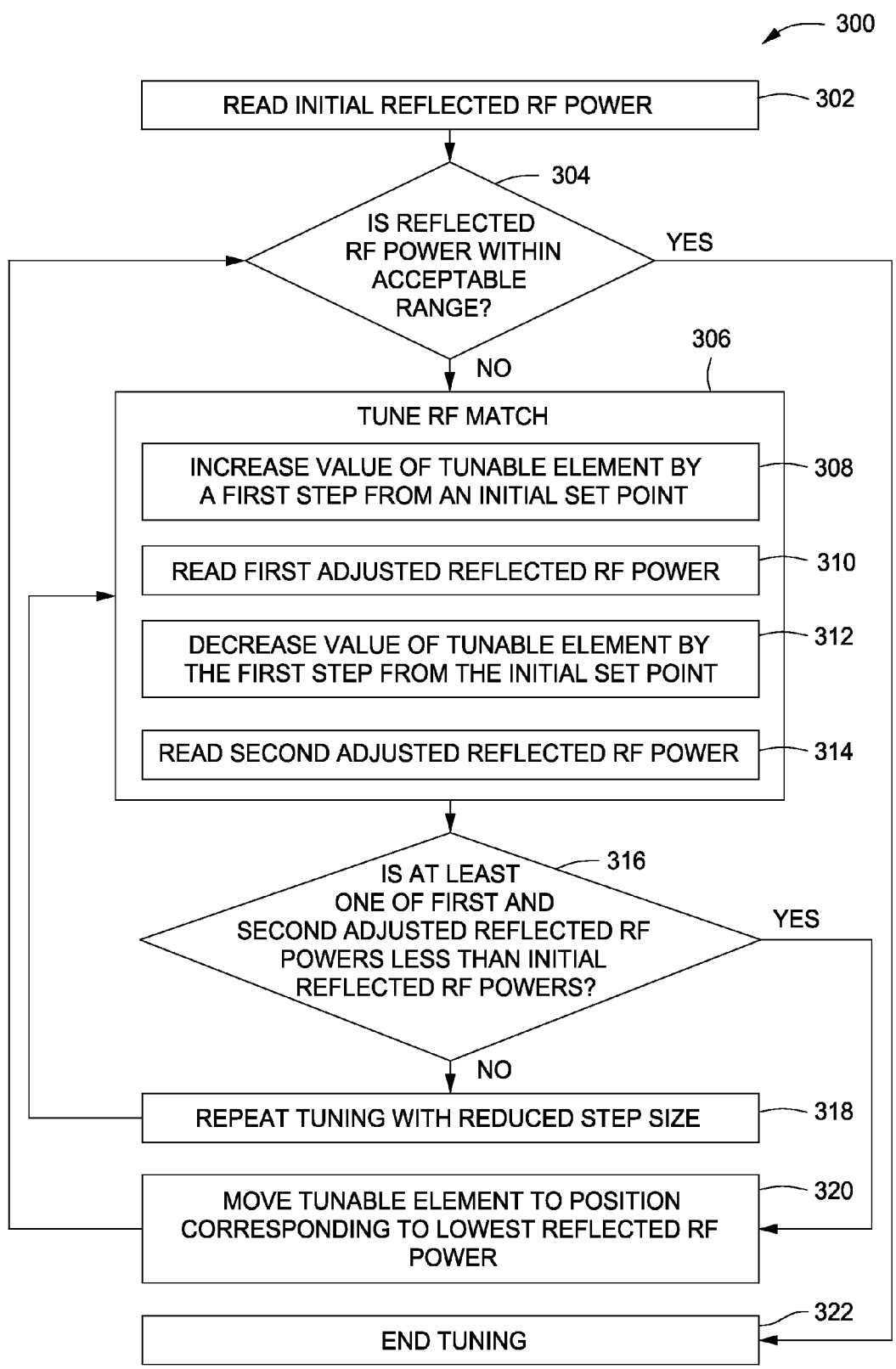
FIGS. 3-6 depict methods of tuning a matching network in accordance with some embodiments of the present invention.

For example, FIG. 3 depicts a method 300 of tuning a matching network in accordance with some embodiments of the present invention. The method 300 may be performed, for example, with the illustrative apparatus disclosed in FIGS. 1 and 2, above. The method 300 generally begins at 302, where an initial reflected RF power is read. Next, at 304, a query is made as to whether the initial reflected RF power is within a predetermined acceptable range. If the initial reflected RF power is within the acceptable range the method proceeds to 322, where the tuning ends. If the initial reflected RF power is not within the acceptable range, the method progresses to 306, where the RF match is tuned.

At 306, the RF match is tuned. The process for tuning the RF match begins at 308, where a tunable element of the match network is adjusted by increasing its value by a predetermined step size from an initial set point. The type of tunable element depends upon the configuration of the particular RF match network being used. A first adjusted reflected RF power is then read at 310. Next, at 312, the tunable element is again adjusted by decreasing its value by the predetermined step size from the initial point. A second adjusted power is then read at 314. The adjustment steps to obtain the adjusted reflected RF power measurements may occur in either order. In some embodiments, a period of time may lapse between the adjustment of the tunable element and the reading of the adjusted reflected RF power, such as between 308 and 310, or between 312 and 314, to allow for stabilization of the system. This time period may vary with respect to the particular process conditions, system being utilized, process performed, etc. For example, a pause of up to about 100 microseconds, or up to about a few milliseconds, or up to about 100 ms, or up to about 2 seconds, or more, may be used to allow the system to stabilize and provide accurate data with regard to the reflected power.

Next at 316 a query is made as to whether at least one of the first and second adjusted reflected powers is less than the initial reflected RF power.

If that query is answered in the affirmative the method proceeds to 320 where the tunable element is adjusted to the position corresponding to the lowest reflected RF power. The method then returns to 304 where a query is made as to whether the reflected RF power determined in 316 and 320 is within the acceptable range. If the reflected power is within the acceptable range the tuning ends at 322 and the method stops. If it is not within the acceptable range the method of tuning the RF match repeats at 306. This method continues until the reflected RF power falls within the acceptable range. By tuning to within an acceptable range, the stability of the system may be increased by not attempting to further adjust the matching networks (which then alters the plasma conditions in the chamber) so long as the reflected power is within the acceptable range.

If the query at 316 is answered in the negative the method proceeds to 318, where the step size for adjusting the tunable element is reduced and the method to tune RF match 306 is repeated using the reduced step size.

Figure 4:
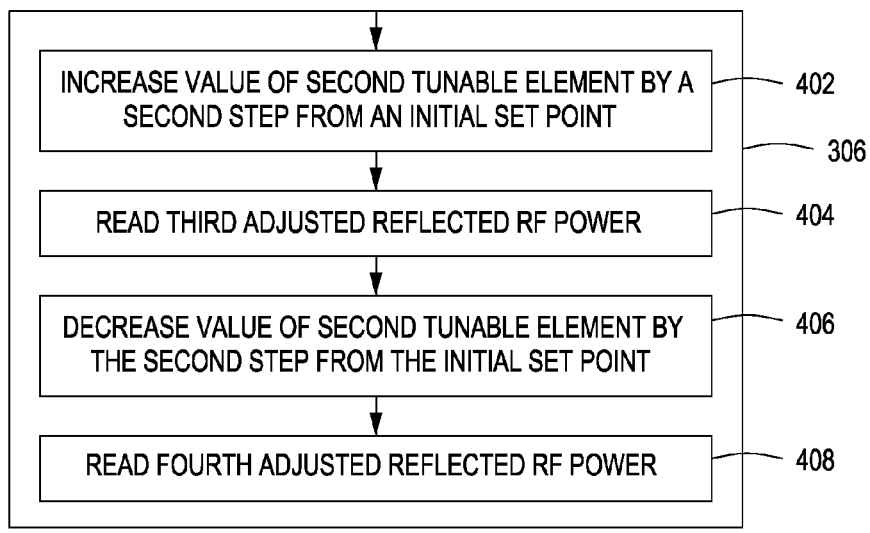

In embodiments where the matching network comprises more than one tunable element, the above methodology may be applied to each of the tunable elements to rapidly tune the matching network to an acceptable state. For example, a variation of the tuning method described above at 306 is shown in FIG. 4 for a matching network having two tuning elements (e.g., a first tunable element and a second tunable element).

In some embodiments, in addition to increasing and decreasing the value of the first tunable element, as described above at 308-314, the second tunable element may also be similarly adjusted and the reflected RF power measured. For example, at 402 the value of the second tunable element may be increased by a second step from an initial set point. The second step may be the same or different in magnitude than the first step. Next, at 404, a third adjusted reflected RF power may be read. At 406, the value of the second tunable element may be decreased by the second step from the initial set point and, at 408, a fourth adjusted reflected RF power may be read. The third and fourth adjusted reflected RF powers may be read in the same manner as described above with respect to the first and second adjusted reflected RF powers.

The comparison of the adjusted reflected RF powers described above at 316 will encompass comparison of all adjusted reflected RF powers (e.g., the first, second, third, and fourth, etc.) to identify the position of the first and second tunable elements that has the lowest reflected RF power. As discussed above, if the lowest reflected RF power is present at the initial position of each of the tunable elements, the tuning method continues with reduced step sizes for each of the first and second steps. If the lowest reflected RF power is present at an adjusted position of one of the tunable elements, then moving the tunable element to the position corresponding to the lowest reflected RF power (discussed at 320, above) refers to the moving either the first or the second tunable element, as appropriate.

Figure 5:
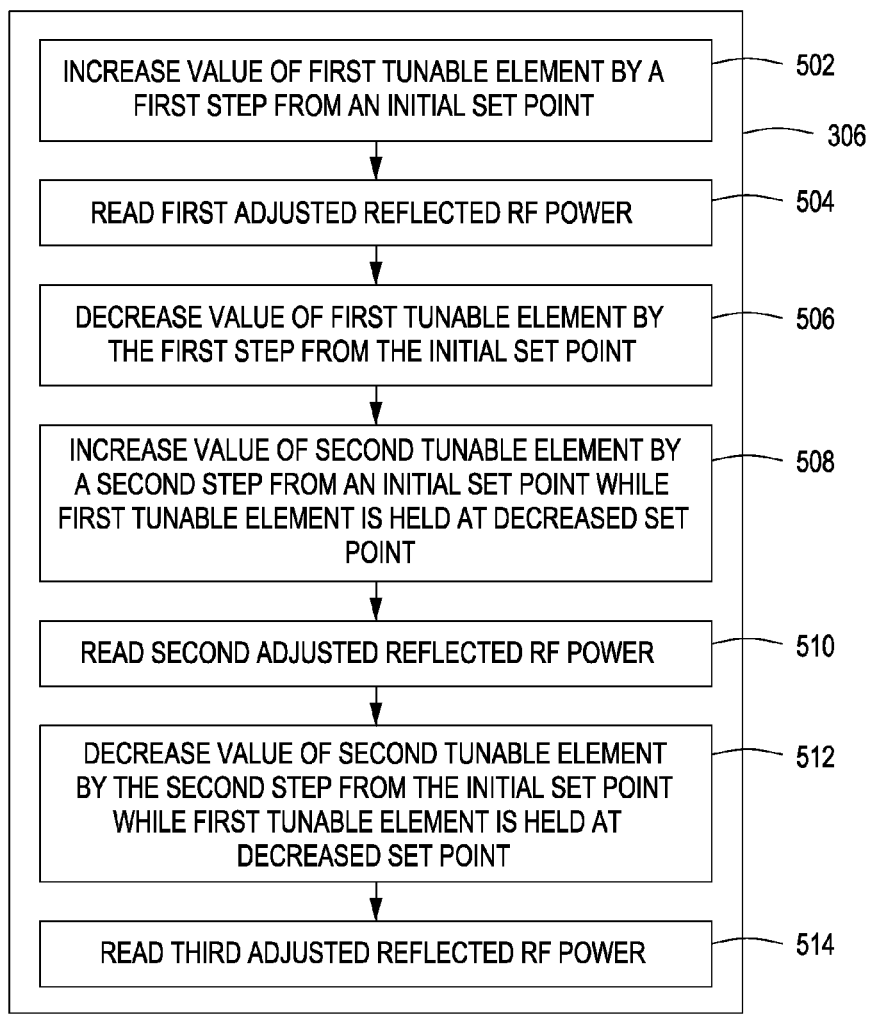

In another example, a variation of the tuning method described above at 306 is shown in FIG. 5 for a matching network having two tuning elements (e.g., a first tunable element and a second tunable element). In some embodiments, the method begins similarly as described above at 308-310, where a value of the first tunable element is increased by a first step from an initial set point (at 502) and a first adjusted reflected RF power is read (at 504).

Next, at 506, The value of the first tunable element may be decreased by the first step from the initial set point. At 508, the value of the second tunable element may be increased by a second step from an initial set point while the first tunable element is held at the decreased set point. As above, the second step may be the same or different in magnitude as the first step. Next, at 510, a second adjusted reflected RF power may be read. At 512, the value of the second tunable element may be decreased by the second step from the initial set point while the first tunable element is still held at the decreased set point. Next, at 514 a third adjusted reflected RF power may be read.

Alternatively, the value of the first tunable element may be decreased and the first reflected RF power read, with the movement of the second tunable element as described above performed in conjunction with increasing the first tunable element to obtain the second and third adjusted reflected RF powers.

The comparison of the adjusted reflected RF powers described above at 316 will encompass comparison of all adjusted reflected RF powers (e.g., the first, second, and third) to identify the position of the first and second tunable elements that has the lowest reflected RF power. As discussed above, if the lowest reflected RF power is present at the initial position of each of the tunable elements, the tuning method continues with reduced step sizes for each of the first and second steps. If the lowest reflected RF power is present at an adjusted position of one or both of the tunable elements, then moving the tunable element to the position corresponding to the lowest reflected RF power (discussed at 320, above) refers to the moving either or both of the first or the second tunable element, as appropriate.

Figure 6:
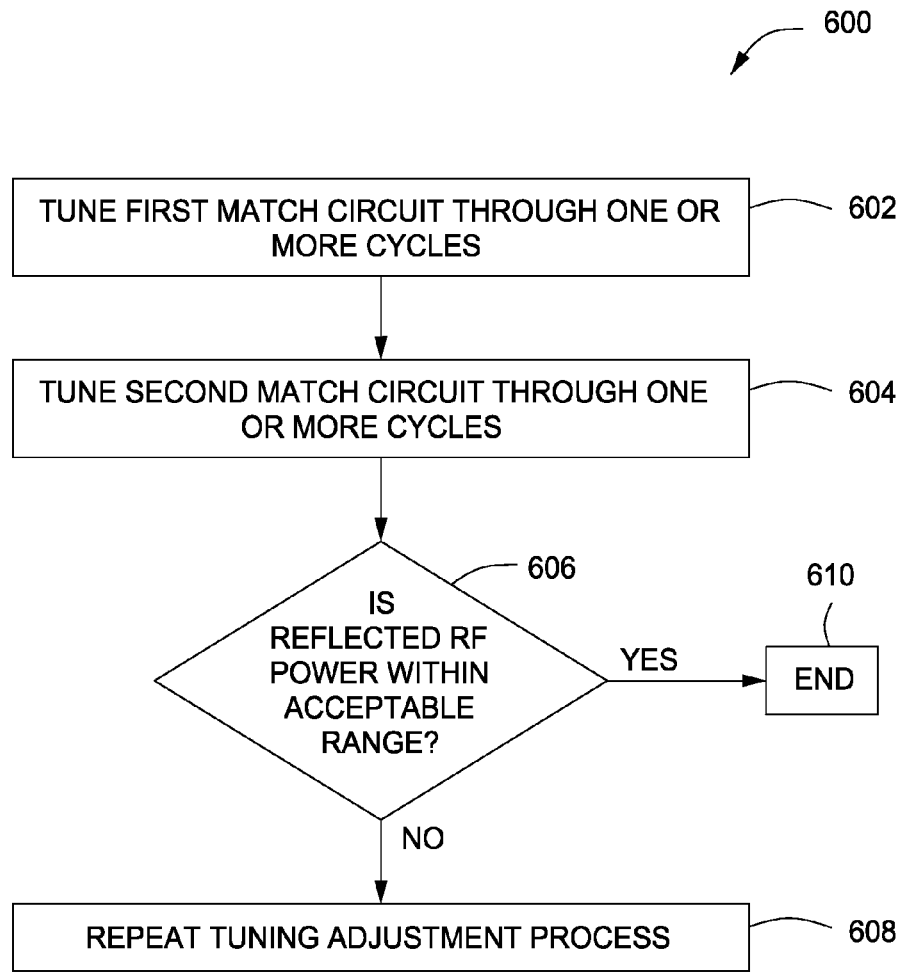

The above tuning methods may be utilized to tune one or a plurality of matching networks in a processing system. In embodiments where a plurality of matching networks are provided, each matching network may be tuned using the above method. In some embodiments, one matching network may be tuned while all other matching networks are held constant. For example, FIG. 6 depicts a method 600 of tuning a plurality of match networks in accordance with some embodiments of the present invention. In some embodiments, one or more iterations of the above method may be run on a first match network while maintaining the other matching networks in a fixed mode (as shown at 602), then (regardless of whether the matching network provides an acceptable reflected power range) one or more iterations of the above method may be run on a second matching network while maintaining the other matching networks in a fixed mode (as shown at 604). This sequence may be continued for any number of matching networks coupled to the process chamber during the plasma process. At 606, a query is made to determine whether the reflected RF power for any one or more of the matching networks is within an acceptable range. For each matching network that provides an acceptable reflected RF power, the method ends (as depicted at 610). For any matching network that continues to provide an unacceptable reflected RF power, the method may continue by repeating the tuning adjustment process as discussed above for the respective matching networks that require further tuning (as depicted at 608).

Tuning a plurality of matching networks in this manner advantageously facilitates more rapid plasma stabilization and match network tuning without interference resultant from concurrent tuning of other matching networks in the system. Moreover, by cycling through the matching networks using only limited iterations of the tuning methodology, large changes in one matching network relative to the other matching networks is avoided, further facilitating stable plasma processing and rapid tuning to an acceptable low reflected power state.

While the foregoing is directed to embodiments of the present invention, other and further embodiments of the invention may be devised without departing from the basic scope thereof.

The invention claimed is:

1. A method of tuning a matching network during a plasma process, comprising:
   (a) providing a matching network coupling an RF source to a load, the matching network having a first tunable element disposed at a first set point;
   (b) increasing a value of the first tunable element by a first step above the first set point;
   (c) sensing a first adjusted value of a reflected RF power;
   (d) decreasing the value of the first tunable element by the first step below the first set point;
   (e) sensing a second adjusted value of the reflected RF power;
   (f) comparing the first and the second adjusted values of the reflected RF power; and
   (g) moving the first tunable element to a second set point that corresponds to a position having a lowest adjusted value of the reflected RF power.

2. The method of claim 1, further comprising:
   (h) determining that the first and second adjusted values of the reflected RF power are not less than an initial reflected RF power corresponding to the matching network having a first tunable element disposed at the first set point;
   (i) increasing the value of the first tunable element by a second step above the second set point, the second step having a value less than that of the first step;
   (j) sensing a third adjusted value of the reflected RF power;
   (k) decreasing the value of the first tunable element by the second step below the second set point;
   (l) sensing a fourth adjusted value of the reflected RF power; and
   (m) comparing the third and the fourth adjusted values of the reflected RF power;
   wherein (h) through (m) occur between (f) and (g).

3. The method of claim 2, further comprising:
   determining that the lowest adjusted value of reflected RF power is within an acceptable range of reflected RF power; and
   maintaining the first tunable element at a position corresponding to the lowest adjusted value of the reflected RF power.

4. The method of claim 1, further comprising:
   determining the lowest adjusted value of reflected RF power is within an acceptable range of reflected RF power; and
   maintaining the first tunable element at a position corresponding to the lowest adjusted value of the reflected RF power.

5. The method of claim 1, further comprising:
(h) determining that the lowest adjusted value of reflected RF power is not within an acceptable range of reflected RF power;
(i) increasing a value of the first tunable element by a first step above the first set point;
(j) sensing a first adjusted value of a reflected RF power;
(k) decreasing the value of the first tunable element by the first step below the first set point;
(l) sensing a second adjusted value of the reflected RF power;
(m) comparing the first and the second adjusted values of the reflected RF power; and
(n) moving the first tunable element to a second set point that corresponds to a position having a lowest adjusted value of the reflected RF power.

6. The method of claim 5, further comprising:
repeating (h) through (n) until the lowest adjusted value of reflected RF power is within an acceptable range of reflected RF power.

7. The method of claim 1, wherein the first tunable elements are capacitors or capacitive shunts to ground.

8. The method of claim 1, wherein the method further comprises:
performing (a) through (g) for a first matching network coupled to a first RF source; and
repeating (a) through (g) for a second matching network coupled to a second RF source.

9. The method of claim 1, wherein the matching network further comprises a second tunable element disposed at a first set point, and further comprising:
(h) increasing a value of the second tunable element by a second step above the first set point;
(i) sensing a third adjusted value of the reflected RF power;
(j) decreasing the value of the second tunable element by the second step below the first set point; and
(k) sensing a fourth adjusted value of the reflected RF power;
wherein (f) further comprises comparing the first, second, third, and fourth adjusted values of the reflected RF power, and wherein (h) through (k) occur prior to (f) and (g), and wherein (g) further comprises moving either the first tunable element or the second tunable element to a second set point that corresponds to a position having a lowest adjusted value of the reflected RF power.

10. The method of claim 1, wherein the matching network further comprises a second tunable element disposed at a first set point, and further comprising:
(h) increasing a value of the second tunable element by a second step above the first set point at the same time as one of increasing or decreasing the value of the first tunable element by the first step;
(i) decreasing the value of the second tunable element by the second step below the first set point while keeping the first tunable element in the same position as in (h); and
(i) sensing a third adjusted value of the reflected RF power;
wherein (f) further comprises comparing the first, second, and third adjusted values of the reflected RF power, wherein (h) through (j) occur prior to (f) and (g), and wherein (g) further comprises moving either or both of the first tunable element or the second tunable element to a second set point that corresponds to a position having a lowest adjusted value of the reflected RF power.

11. A non-transitory computer readable medium, having instructions stored thereon which, when executed by a controller, performs a method that causes the tuning of a match network, the match network coupling an RF source to a load and having a tunable element disposed at a first set point, the method further comprising:
(a) increasing a value of the tunable element by a first step above the first set point;
(b) sensing a first adjusted value of a reflected RF power;
(c) decreasing the value of the tunable element by the first step below the first set point;
(d) sensing a second adjusted value of the reflected RF power;
(e) comparing the first and the second adjusted values of the reflected RF power; and
(f) moving the tunable element to a second set point that corresponds to a position having a lowest adjusted value of the reflected RF power.

12. The computer readable medium of claim 11, further comprising:
(g) determining that the first and second adjusted values of the reflected RF power are not less than an initial reflected RF power corresponding to the matching network having a tunable element disposed at the first set point;
(h) increasing the value of the tunable element by a second step above the second set point, the second step having a value less than that of the first step;
(i) sensing a third adjusted value of the reflected RF power;
(j) decreasing the value of the tunable element by the second step below the second set point;
(k) sensing a fourth adjusted value of the reflected RF power; and
(l) comparing the third and the fourth adjusted values of the reflected RF power;
wherein (g) through (l) occur between (e) and (f).

13. The computer readable medium of claim 12, further comprising:
determining the lowest adjusted value of reflected RF power is within an acceptable range of reflected power; and
maintaining the tunable element at a position corresponding to the lowest adjusted value of the reflected RF power.

14. The computer readable medium of claim 11, further comprising:
determining the lowest adjusted value of reflected RF power is within an acceptable range of reflected power; and
maintaining the tunable element at a position corresponding to the lowest adjusted value of the reflected RF power.

15. The computer readable medium of claim 11, further comprising:
(g) determining that the lowest adjusted value of reflected RF power is not within an acceptable range of reflected RF power;
(h) increasing a value of the tunable element by a first step above the first set point;
(i) sensing a first adjusted value of a reflected RF power;
(j) decreasing the value of the tunable element by the first step below the first set point;
(k) sensing a second adjusted value of the reflected RF power;
(l) comparing the first and the second adjusted values of the reflected RF power; and
(m) moving the tunable element to a second set point that corresponds to a position having a lowest adjusted value of the reflected RF power.

16. The computer readable medium of claim 11, wherein the method further comprises:
performing the method a number of times wherein a first RF source provides power, then performing the method a number of times wherein a second RF source provides power.

17. The computer readable medium of claim 11, wherein the method further comprises:
performing (a) through (f) for a first matching network coupled to a first RF source; and
repeating (a) through (f) for a second matching network coupled to a second RF source.

18. The computer readable medium of claim 11, wherein the matching network further comprises a second tunable element disposed at a first set point, and further comprising:
(g) increasing a value of the second tunable element by a second step above the first set point;
(h) sensing a third adjusted value of the reflected RF power;
(i) decreasing the value of the second tunable element by the second step below the first set point; and
(j) sensing a fourth adjusted value of the reflected RF power;
wherein (e) further comprises comparing the first, second, third, and fourth adjusted values of the reflected RF power, and wherein (g) through (j) occur prior to (e) and (f).

19. The computer readable medium of claim 11, wherein the matching network further comprises a second tunable element disposed at a first set point, and further comprising:
(g) increasing a value of the second tunable element by a second step above the first set point at the same time as one of increasing or decreasing the value of the tunable element by the first step;
(h) decreasing the value of the second tunable element by the second step below the first set point while keeping the tunable element in the same position as in (h); and
(i) sensing a third adjusted value of the reflected RF power;
wherein (e) further comprises comparing the first, second, and third adjusted values of the reflected RF power, and wherein (g) through (i) occur prior to (e) and (f).

20. A system for plasma processing of a substrate, comprising:
a process chamber for processing a substrate;
a first RF source coupled to the process chamber through a first matching network coupled;
a second RF source coupled to the process chamber through a second matching network; and
a controller comprising computer readable medium having instructions stored thereon that, when executed, performs a method that causes the controller to tune the first matching network and the second matching network to a load during a plasma process, wherein the first matching network coupled the first RF source to the load and includes a first tunable element disposed at a first set point, and wherein the method further comprises:
(a) increasing a value of the first tunable element by a first step above the first set point;
(b) sensing a first adjusted value of a reflected RF power;
(c) decreasing the value of the first tunable element by the first step below the first set point;
(d) sensing a second adjusted value of the reflected RF power;
(e) comparing the first and the second adjusted values of the reflected RF power; and
(f) moving the first tunable element to a second set point that corresponds to a position having a lowest adjusted value of the reflected RF power.

* * * * *